(12) United States Patent
Lew et al.

(10) Patent No.: US 9,431,599 B2
(45) Date of Patent: Aug. 30, 2016

(54) NON-VOLATILE LOGIC DEVICE

(71) Applicant: NANYANG TECHNOLOGICAL UNIVERSITY, Singapore (SG)

(72) Inventors: Wen Siang Lew, Singapore (SG); Chandrasekhar Murapaka, Singapore (SG); Indra Purnama, Singapore (SG); Sarjoosing Goolaup, Singapore (SG); Pankaj Sethi, Singapore (SG); Chinkhanlun Guite, Singapore (SG)

(73) Assignee: NANYANG TECHNOLOGICAL UNIVERSITY, Singapore (SG)

( * ) Notice: Subject to any disclaimer, the term of this patent is extended or adjusted under 35 U.S.C. 154(b) by 0 days.

(21) Appl. No.: 14/782,318

(22) PCT Filed: May 19, 2014

(86) PCT No.: PCT/SG2014/000218
§ 371 (c)(1),
(2) Date: Oct. 3, 2015

(87) PCT Pub. No.: WO2014/185866
PCT Pub. Date: Nov. 20, 2014

(65) Prior Publication Data
US 2016/0133827 A1     May 12, 2016

Related U.S. Application Data

(60) Provisional application No. 61/824,738, filed on May 17, 2013.

(51) Int. Cl.
*G06F 7/38*      (2006.01)
*H03K 19/173*    (2006.01)
(Continued)

(52) U.S. Cl.
CPC ............... *H01L 43/02* (2013.01); *H03K 19/20* (2013.01); *H01L 43/08* (2013.01)

(58) Field of Classification Search
None
See application file for complete search history.

(56) References Cited

U.S. PATENT DOCUMENTS 7,551,469 B1 *   6/2009  Parkin ..................... G11C 11/14
                                                365/158
8,358,153 B2 *   1/2013  Worledge ............. H03K 19/168
                                                326/104
(Continued)

FOREIGN PATENT DOCUMENTS

WO    2012035355 A2    3/2012
WO    2014185866 A1    11/2014

OTHER PUBLICATIONS

Foreign Communication From a Related Counterpart Application, International Search Report and Written Opinion dated Jul. 22, 2014, International Application No. PCT/SG2014/000218 filed on May 19, 2014.
Imre, A., et al., "Majority Logic Gate for Magnetic Quantum-Dot Cellular Automata", Science Magazine vol. 311 p. 205, Jan. 13, 2006.
(Continued)

*Primary Examiner* — Anh Tran

(57) ABSTRACT

A non-volatile logic device, comprising: a first input element magnetizable along a first direction to impart or change a chirality of a domain wall traversing the first input element a second input element configured to transport the domain wall, a magnetization of the second input element along a second direction representing a second logical input; a bifurcated output section comprising a pair of output elements for receiving the domain wall from the second input element, a magnetization of at least part of the output elements being changeable by propagation of the domain wall along the output elements; and a non-magnetic conductive element; wherein the magnetization in an output element after propagation of the domain wall represents a value of a logical function selectable by passing an electrical current through the non-magnetic conductive element to induce a magnetic field of a desired magnitude and direction in the second input element.

20 Claims, 10 Drawing Sheets

(51) Int. Cl.
*H01L 43/02* (2006.01)
*H03K 19/20* (2006.01)
*H01L 43/08* (2006.01)

(56) References Cited

U.S. PATENT DOCUMENTS

2005/0226103 A1    10/2005  Cowburn
2007/0030718 A1*    2/2007  Cowburn .......... G11C 19/0808
                                                          365/55
2008/0278998 A1    11/2008  Cowburn
2010/0124091 A1     5/2010  Cowburn

OTHER PUBLICATIONS

Richter, R., et al., "Field programmable spin-logic realized with tunnelling-magnetoresistance devices", Solid-State Electronics vol. 36, p. 639, 2002.

Allwood, D., et al., "Magnetic Domain-Wall Logic", Science Magazine, vol. 309, p. 1688, Sep. 9, 2005.

Zeng, Huang T., et al., "The influence of wire width on the charge distribution of transverse domain walls and their stray field interactions", Journal of Magnetism and Magnetic Materials, vol. 322, 2010.

* cited by examiner

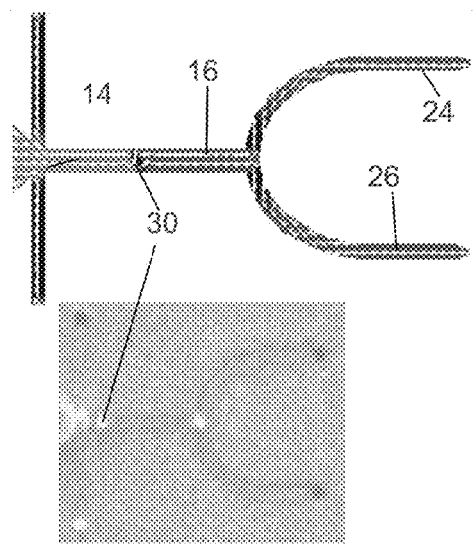 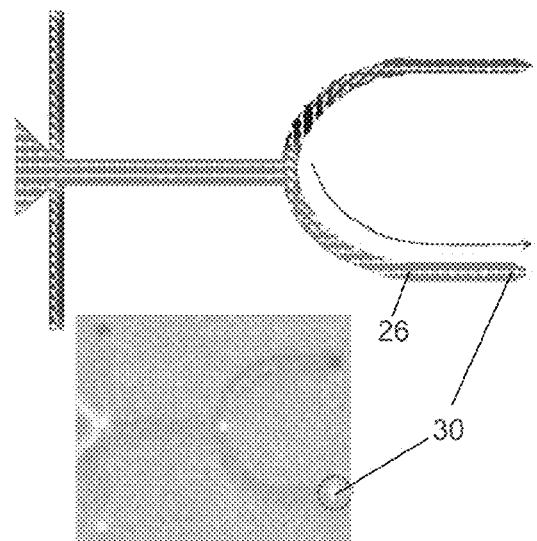
FIGURE 3(a)  FIGURE 3(b)
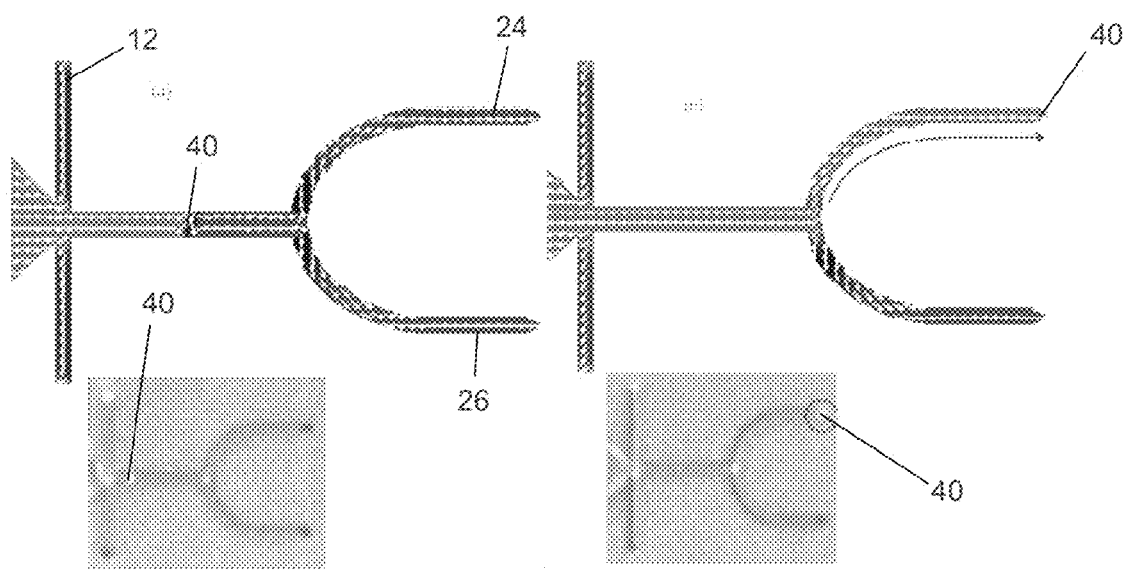
FIGURE 4(a)  FIGURE 4(b)

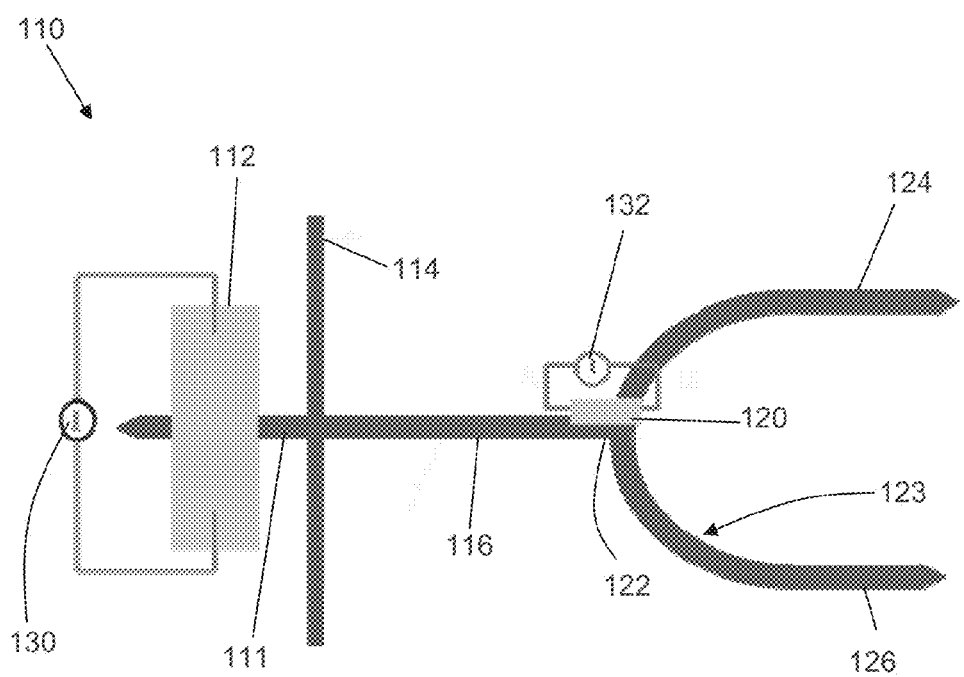

NON-VOLATILE LOGIC DEVICE

CROSS-REFERENCE TO RELATED APPLICATIONS

This application is a filing under 35 U.S.C. 371 as the National Stage of International Application No. PCT/SG2014/000218, filed May 19, 2014 and entitled "NON-VOLATILE LOGIC DEVICE," which claims the benefit of and priority to U.S. Provisional Application No. 61/824,738 filed May 17, 2013, both of which are incorporated herein by reference in their entirety for all purposes.

BACKGROUND

In present microelectronics technology, data storage is non-volatile (spin-based), whereas data processing is volatile (charge-based). Recently, attempts have been made to create architectures which are completely non-volatile. Spintronics, an alternative to microelectronics, represents one such attempt. The aim of spintronics-based devices is to store and process data solely in ferromagnetic materials, and to make the device completely non-volatile so as to increase its speed while reducing power consumption.

Many attempts have been made towards the realization of spin-logic or magnetic logic. For example, Imre et al. (2006, *Science* 311, p. 205) demonstrated magnetic logic based on a network of magnetostatically coupled magnetic elements, a scheme called magnetic cellular automata. The magnetostatically coupled ferromagnetic islands perform the logic operations by summing up the stray fields at the nodal dots which have different threshold switching fields. The main disadvantage of this device is that the magnetostatic coupling is weak compared to the demagnetizing fields. A small change in the structure during the fabrication results in completely different results.

Magnetic tunnel junction (MTJ) based logic devices have previously been proposed (for example, see R. Richter et al. (2002) *Solid State Electron.* 46, 639). The high current density required for the operation of these devices is their main disadvantage.

Alternative magnetic logic architectures are based on propagation of domain walls (DW) through a network of nanowires under the influence of a rotating external magnetic field—see D. Allwood et al. (2005) *Science* 309, 1688, the entire contents of which are hereby incorporated by reference. Allwood et al. fabricated four different structures in order to perform specific logic functions (AND, NOT, cross-over and fan-out).

SUMMARY OF THE INVENTION

In a first aspect, the present invention provides a non-volatile logic device, comprising:
 a first input element which is magnetizable along a first direction of magnetization to impart or change a chirality of a domain wall traversing the first input element, the chirality representing a first logical input;
 a second input element joined to the first input element to transport the domain wall, the second input element being magnetizable along a second direction of magnetization which is orthogonal to the first direction of magnetization, a magnetization of the second input element along the second direction of magnetization representing a second logical input;
 a bifurcated output section connected to the second input element at a junction, the output section comprising a pair of output elements for selectively receiving the domain wall from the second input element, a magnetization of at least part of the respective output elements being changeable by propagation of the domain wall along the respective output elements; and
 a non-magnetic conductive element disposed in partially overlapping relationship with the second input element at or near the junction;
 wherein the magnetization in an output element after propagation of the domain wall represents a value of a logical function of the first logical input and/or the second logical input, or a logical complement of the value; and
 wherein the logical function is selectable by passing an electrical current through the non-magnetic conductive element to induce a magnetic field of a desired magnitude and direction in the second input element.

By providing two input elements having mutually orthogonal directions of magnetization, it is possible to implement the logic device using linear, rather than rotating, magnetic fields. Linear fields are much easier to implement on-chip in a spintronics-based device than rotating fields.

Further, by having a branched output structure, it is possible to simultaneously obtain measurements of values of two different logic functions, one being the complement of the other (for example, the output of an AND function along one branch, and the output of a NAND function along the other branch).

The device may further comprise a domain wall generator coupled to the first input element, the domain wall generator being configured to nucleate a domain wall. The domain wall generator may comprise a ferromagnetic element having low shape anisotropy, for example a diamond-shaped pad which is connected to the first input element at one of its vertices. In other embodiments, the domain wall generator may comprise a magnetic material which is in contact with a current-carrying nanowire, the current-carrying nanowire being configured to effect a local magnetization reversal in the magnetic material by an induced Oersted field. The domain wall generator may be joined to the first input element and the second input element at a junction between the first and second input elements.

The non-magnetic conductive element may be a strip of a non-magnetic conductive material in contact with part of the second input element at or near the junction with the output section. When a current is passed through the strip of conductive material, an Oersted field is induced in a non-contact part of the second input element in a direction transverse to the strip. This advantageously allows the dynamics of a domain wall passing through the non-contact part to be influenced in a predetermined manner, thereby allowing the logic function of the device to be readily reconfigured. The logic device may be reconfigured by changing the direction of the current, and/or by imposing an additional condition on the current based on the magnetization of the first input element and/or of the second input element. Embodiments of the invention, therefore, provide a reconfigurable magnetic logic device which can perform all of the basic logic operations and which is purely magnetic. The reconfigurability of the device allows it to perform all the basic logic operations using the same physical structure, thereby reducing the production cost.

The first and second input elements and the output section are preferably each formed from a magnetic material capable of exhibiting in-plane magnetic anisotropy, for example a ferromagnetic material such as permalloy ($Ni_{80}Fe_{20}$). Preferably, the first and second input elements and the output section are formed as a unitary structure. The unitary structure is preferably a planar structure. The planar structure may have a depth of approximately 10 nm or less.

The first input element is preferably an elongate structure such as a nanowire, with the long axis of the first input element defining the first direction of magnetization. The nanowire may have an aspect ratio (ratio of length to width) of about 50:1 or greater. The nanowire may be approximately 5 um in length and approximately 100 nm in width, for example. Likewise, the second input element is preferably a nanowire, with the long axis of the second input element defining the second direction of magnetization. The second input element may be approximately 2 um long and 140 nm wide, up to 160 nm wide, for example. The first input element and the second input element may be joined orthogonally to each other at an input junction, and the domain wall generator may be joined with the first and second input elements at the input junction.

In certain embodiments, each output element may have an end portion which is substantially parallel to the second input element. The output section may be substantially U-shaped, comprising two substantially half-U shaped output elements, for example.

BRIEF DESCRIPTION OF THE DRAWINGS

Embodiments of the invention will now be described, by way of non-limiting example only, with reference to the accompanying drawings in which:

FIGS. 3(a) and 3(b) show snap shot images of simulated TT-U DW propagation, and corresponding magnetic force microscopy (MFM) images, of the device of FIG. 1;

FIGS. 4(a) and 4(b) show snap shot images of simulated TT-D DW propagation, and corresponding magnetic force microscopy (MFM) images, of the device of FIG. 1;

FIGS. 10(a) and 10(b) show MFM images of the device before and after a logic operation for the input combinations of (0&1) and (1&0) when a current of 5 mA is applied along the conductive strip in a second direction opposite the first direction;

FIG. 11 schematically depicts an alternative embodiment of a non-volatile logic device;

DETAILED DESCRIPTION OF EMBODIMENTS

Figure 1:
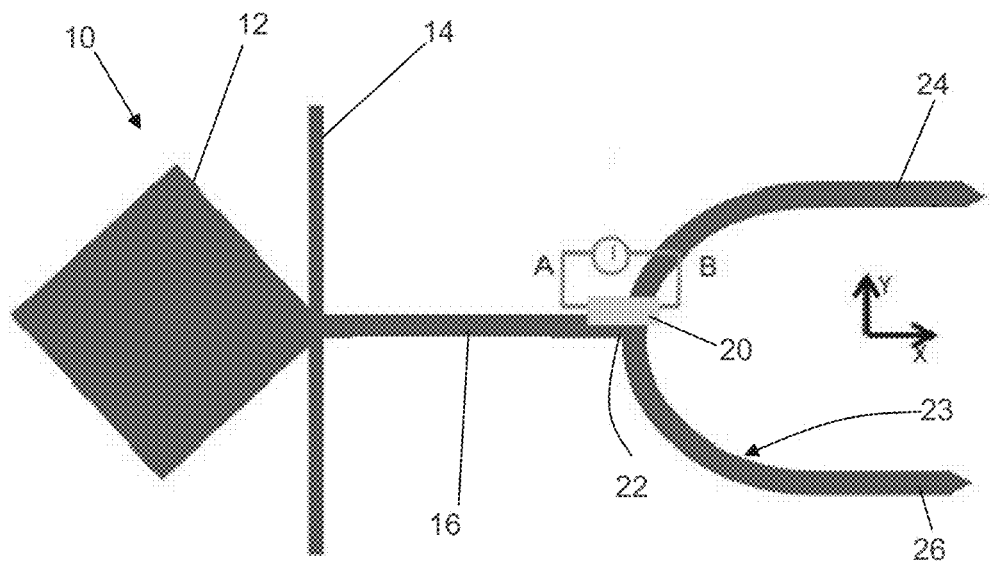
FIG. 1 is a schematic depiction of a reconfigurable magnetic logic device according to embodiments.

Referring initially to FIG. 1, there is shown a non-volatile magnetic logic device 10 comprising a domain wall (DW) generator 12, a first input element 14 coupled to the DW generator 12, and a second input element 16 coupled to the first input element 14 at a first end. At a second end of the second input element 16, it is joined at a junction 22 to an output section in the form of a U-shaped section 23 having two output elements 24 and 26. Located at branch point 22 is a conductive strip 20 which is in electrical contact with the second input element and with the first or upper output element 24. In some embodiments, the conductive strip 20 may alternatively be in electrical contact with the second or lower output element 26. The conductive strip 20 partially overlaps with the second input element 16, preferably across about 25% of its width.

The device 10 may comprise a unitary structure comprising the DW generator 12, first and second input elements 14 and 16, and output section 23, with conductive strip 20 being a separately formed component which is placed in electrical contact with the unitary structure.

The conductive strip 20 is formed of a non-magnetic electrically conductive material such as gold, or a layered strip of two or more non-magnetic conductors, such as a Cr(5 nm)/Au(100 nm) strip, or a Ti/Au, Ta/Au or Cu/Au strip, for example. A single layer of gold may be used, though a multilayer structure is preferred as the additional layer on top of the gold layer improves adhesion to silicon, and helps to control peel-off.

The unitary structure is formed of a material capable of exhibiting in-plane magnetic anisotropy, preferably a ferromagnetic material, such materials being particularly suitable for DW propagation. A preferred material is permalloy ($Ni_{80}Fe_{20}$), but other materials such as Ni, CoFe and the like may also be used. The unitary structure is substantially planar, and has a thickness of about 10 nm or less in order to avoid formation of vortex walls in NiFe. Other unitary structure thicknesses may be appropriate for other magnetic metals or magnetic alloys, as known in the art.

In general terms, the device 10 functions by nucleating a DW using DW generator 12, and driving the DW into the second input element 16 using a linear magnetic field. The logic function to be performed by the device 10 is determined by the dynamics of the field-driven DW as will later be described in detail.

The device 10, in its preferred form, comprises five parts: (1) DW generator 12, (2) a chirality selector 14, (3) a nanowire 16, (4) an orthogonal U-shape structure 23 which has two branches 24, 26 as outputs of two complementary logic operations and (5) a metal strip 20 at the junction between the nanowire 16 and the U-shape 23 which acts as a current-configurable gate to control the nature of the logic operation.

DW Generator 12

The DW generator 12 may be a diamond-shaped pad, one vertex of which is connected to the left edge of the second magnetic element 16, and also to the first magnetic element 14 which extends transversely to the second magnetic element 16. The dimensions of the pad may be of the order of 2 μm×2 μm, although the precise dimensions are not critical. In general, the larger the dimensions of the pad, the easier (and quicker) it is to nucleate a DW. When the pad 12 is magnetically saturated in one direction and the magnetic field is then reversed, the magnetization in the diamond shaped pad 12 undergoes switching at a lower field compared to the nanowire (second magnetic element) 16 magnetization due to the pad having less shape anisotropy than the nanowire 16. The reversal mechanism leads to nucleation of a DW into the nanowire structure 16. A head-to-head (HH) DW is injected when the magnetization is saturated in the −X-direction (the X and Y directions being indicated schematically at the right of FIG. 1, the −X direction being to the left of the page) and a tail-to-tail (TT) DW is injected when the magnetization is saturated in the +X-direction. The shape of the DW generator can vary, provided that it has higher shape isotropy (equivalently, lower shape anisotropy) than that of the nanowire 16 such that the reversal mechanism will be effective. For example, other shapes having high shape isotropy, such as circles, rectangles, squares or regular polygons may also be used. Instead of the reversal mechanism, the DW can alternatively be generated by any other suitable alternative method, such as local magnetization reversal by an Oersted field induced by a current carrying nanowire (not shown).

DW Chirality Selector 14

The first input element 14, which is transverse to the nanowire 16 and which is located at the junction 13 between the DW generator 12 and the nanowire 16, acts as a DW chirality selector. The strip is preferably about 5 μm long in the Y-direction and about 100 nm wide in the X-direction. Different dimensions for the strip 14 are possible, although it is preferred that an aspect ratio of about 50:1 (Y-dimension:X-dimension) or greater is maintained. Due to the high aspect ratio and thus large shape anisotropy of the strip 14, the magnetization in the strip 14 is not affected by the field applied along the X-axis. The magnetization of the DW chirality selector 14 can be saturated along the +Y- or −Y-direction by a transverse magnetic field of 300 Gauss. As is known in the art, the magnetic field magnitude required for saturation will generally depend on the width (X-dimension) of the chirality selector 14; if the width is lower than 100 nm, then a transverse magnetic field greater than 300 Gauss will be required.

When the magnetization of the DW chirality selector 14 is saturated in the +Y-direction, the DW injected into the nanowire 16 will have a transverse magnetization component along the +Y-direction, which is defined herein as the "Up" chirality. When the magnetization of the DW chirality selector 14 is reversed (−Y-direction), the DW injected will have a transverse magnetization component along the −Y-direction, which is defined herein as the "Down" chirality. The magnetization of the chirality selector 14 is used to represent a first input for the logic operation. When the magnetization is saturated in +Y-direction, this is defined as logical "1", whereas when the magnetization is saturated along the −Y-direction, this is defined as logical "0".

Nanowire 16

The second input element 16 is a nanowire which is orthogonal to the chirality selector 14, and which is preferably about 2 μm long (i.e., 2 μm along the X-direction) and about 140 nm wide (Y-direction). The length of the nanowire 16 is not critical, but the width is preferably no greater than 160 nm for a 10 nm thick NiFe device 10, to accommodate transverse DW relaxation (other thicknesses may be desirable for alternative magnetic metals or alloys, as known in the art). The nanowire 16 is a medium for DW propagation from the input to the output for the logic operation. The magnetization direction of the nanowire 16 represents a second input i.e. the magnetization along the +X-direction is defined as logical "1" and the magnetization along the −X-direction is defined as logical "0".

Orthogonal U-Shaped Structure 24, 26

The output of the logic operation can be measured at one of the branches 24 or 26 of a U-shaped structure which is connected to the nanowire 16 at a junction 22. The definitions of logic states are the same as for the second input (the magnetization of the nanowire 16). The magnetization along the +X-direction is defined as logical "1" whereas the magnetization along the −X-direction is defined as logical "0".

Each branch 24, 26 extends from the junction 22 in a half-U, curving outwardly and transitioning into a linear portion which is substantially parallel to the nanowire 16. In some embodiments the branches 24, 26 need not be parallel, though it is convenient to have the linear output portions aligned with the magnetization direction of the nanowire 16.

Metal Strip 20

A rectangular metal strip 20 is placed at the junction 22 between the nanowire 16 and the orthogonal U-shaped structure 24, 26. The strip 20 is preferably about 200 nm wide and about 400 nm long, although the dimensions are not critical provided the strip 20 is capable of generating a 200 Gauss magnetic field (see below). The material for the strip is preferably a layered structure of Cr(5 nm)/Au(100 nm), but it may also comprise an alternative non-magnetic conductor such as copper. The metal strip 20 is contacted with the nanowire 16 at the junction such that it only partially overlaps the nanowire 16. In the depicted embodiment, the strip 20 is placed to one side of the junction 22 between the input (nanowire 16) and output (orthogonal U-shape 24) such that it has an approximate 25% overlap with the width of the nanowire 16, and preferably less than 30% overlap since the charge distribution of the DW is such that 70% of the positive charge is concentrated in a 30% window of the nanowire width (see below). The purpose of the metal strip 20 is to generate an induced Oersted field when a current is injected into it, to influence the dynamics of a DW reaching the junction 22. The local magnetic field generated at the junction 22 plays a vital role both in the logic operation and selectability of the logic function implemented by the device 10 (reconfigurability). The metal strip 20 may be thought of as a "gate".

With reference to FIG. 1, the magnetization direction of the chirality selector (Input 1) and the magnetization direction of the nanowire (Input 2) can be used as binary inputs to a logic operation. The output of the logic operation can be obtained either from the magnetization direction of the upper half ring (UHR) 24 or the lower half ring (LHR) 26. The magnetization directions are always complementary to each other in the outputs 24, 26, which gives a significant advantage of being able to obtain two different logic results with a single device in a single operation (e.g. NAND and AND). Table 1 shows an exemplary mapping between magnetization directions My and logical values for input 1, magnetization directions Mx and logical values for input 2, and magnetization directions M at the output and logical values for the output.

TABLE 1

| Input 1 | | Input 2 | | Output | |
|---|---|---|---|---|---|
| Input 1, $M_y$ | Bit | Input 2, $M_x$ | Bit | Output, M | Bit |
| ↑ | 1 | → | 1 | → | 1 |
| ↓ | 0 | ← | 0 | ← | 0 |

In exemplary embodiments of the device 10, four possible combinations of logical values for two input binary logic operations can be defined according to the domain wall type (either HH or TT) and the chirality of the domain wall (either "up" or "down"). The DW type can be controlled by the initial magnetization direction, while the chirality can be controlled by the magnetization direction of chirality selector 14. Controlled motion of the DW through the nanostructure 10 can be used to perform all basic logic operations. To assist in understanding the working mechanism, two features of transverse DWs which are useful in realizing a reconfigurable magnetic logic device 10 will now be discussed.

DW Selective Switching

Figure 2:
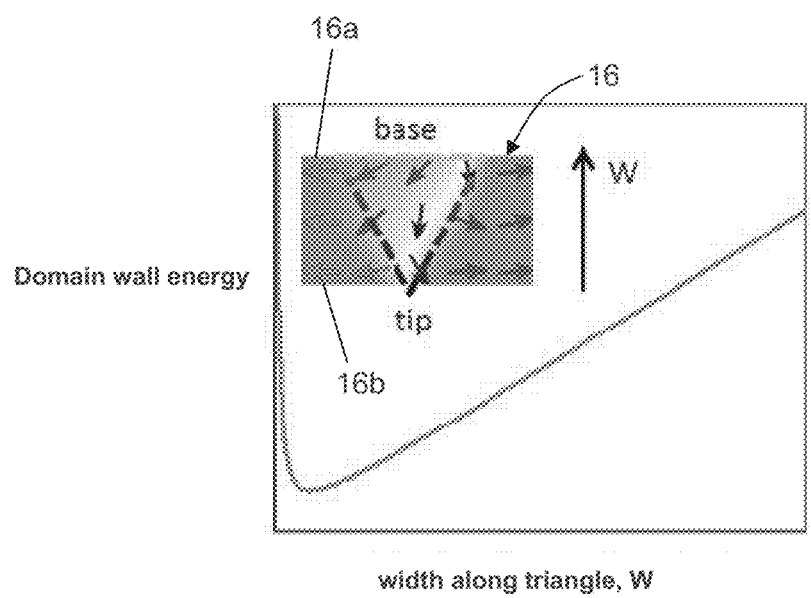
FIG. 2 shows the transverse energy distribution of a domain wall (DW)

When a transverse DW is driven through a nanowire 16 connected to the orthogonal half-ring 23 shown in FIG. 1, the DW has to choose one of the two branches 24, 26 of the half-ring to move towards the end of the structure 10. The transverse energy distribution of the DW determines which branch 24 or 26 into which the DW will move. The energy of the transverse DW is a function of its lateral width. This is schematically illustrated in FIG. 2, which shows the transverse energy distribution of a chirality-down tail-to-tail (TT) DW (also termed a TT-D herein; a chirality-up TT DW is denoted as TT-U) plotted against the DW lateral size, with the region of the nanowire 16 containing the DW depicted in the inset. The DW energy increases from the tip to the base of the approximately triangularly shaped TT-D DW.

The higher width at the base of the triangular shape of the DW means that the base region stores more energy than the apex region. Depending on the chirality of the DW (transverse component direction), the base of the transverse DW is aligned with either the upper edge 16a (+Y-) or the lower edge 16b (−Y-) of the nanowire 16. The DW selective switching in the half ring 23 into one of the branches 24 or 26 depends on its transverse energy distribution.

For example, when a TT-U 30 is injected into the nanowire 16 as shown in FIG. 3(*a*), the base of the TT-U is aligned with the lower edge 16b of the nanowire so that the DW 30 has higher energy at the bottom.

When a magnetic field is applied to drive the DW 30 along the +X-direction and is increased to 250 Gauss, the higher energy at the lower edge 16b makes it more energetically favourable for the DWs 30 to pass through the LHR 26. The DW switches magnetization of the LHR 26 as can be seen from the magnetization configuration in FIG. 3(*b*). The magnetic contrast in the MFM image at the UHR 24 is unchanged but there is a change in the magnetic contrast from dark to bright in the LHR 26, which clearly shows that the DW motion leads to a selective switching of the LHR 26 magnetization.

The threshold field required to influence the DW dynamics will, in general, depend on the dimensions of the nanowire 16 and of the angle between the nanowire 16 and the output branches 24, 26 at the junction 22. In particular, the threshold field increases as the angle increases, and decreases as the width of the nanowire 16 increases. The magnitude of decrease or increase of the threshold field can be determined empirically in straightforward fashion, or may be estimated by micromagnetic simulations, for example.

When the magnetization direction of the chirality selector 14 is flipped, a TT-D 40 is injected into the nanowire 16 as shown in the simulated magnetization in FIG. 4(*a*). and the magnetic field to drive the DW along the +X-direction increased to 250 Gauss. Contrary to the previous case of TT-U 30, the base of the DW 40 is aligned with the upper edge 16a of the nanowire and the DW 40 has higher energy at the upper edge 16a of the nanowire. The higher energy at the upper edge 16a leads to the DW 40 propagating into the UHR 24, resulting in switching of the UHR 24 and leaving the LHR 26 unchanged. The change in the magnetic contrast from dark to bright in the UHR 24 can be clearly seen in the MFM image shown in FIG. 4(*b*). The DW selective switching into the U-shaped half ring 23, which depends on the magnetization directions of the first input element 14 and the second input element 16, defines the logic operation in embodiments of the device 10.

DW Charge Distribution and the Effect of Transverse Magnetic Field

Figure 5:
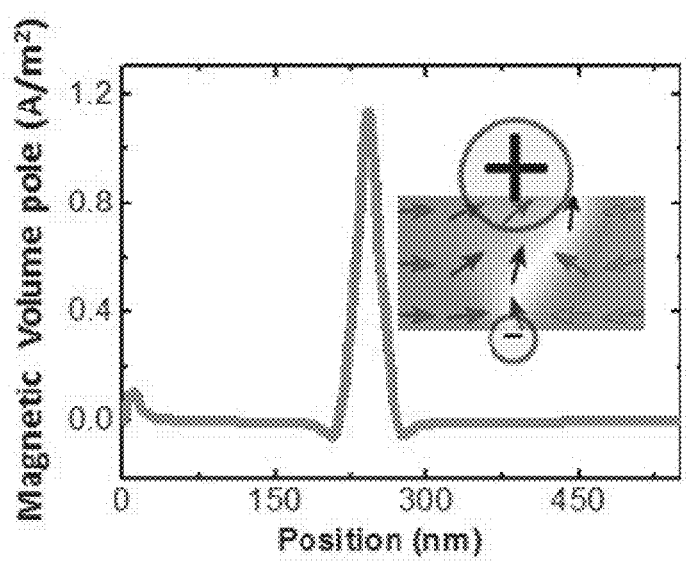
FIG. 5 is a schematic graph of the magnetic volume pole along the length of a nanowire of the device of FIG. 1, with a HH DW propagating down the nanowire.

A transverse DW possesses magnetic charge, due to the convergence (divergence) of the magnetization at the DW—H. T. Zeng et al. (2010) *J. Magn. Magn. Mater.* 322, 2010. A HH DW is equivalent to a positive magnetic charge, while a TT DW is equivalent to a negative charge. Due to the opposite magnetic charges, the two types of DW move in opposite directions in the presence of a magnetic field. The charge distribution of the DW along the nanowire can be calculated by taking the divergence of the magnetization. In FIG. 5, the magnetic volume pole of a HH DW is plotted against its position on the nanowire. The magnetic volume pole is analogous to the magnetic charge. The DW charge distribution shows that for HH DW, the base of the triangle possesses a positive magnetic charge whereas the apex possesses a negative magnetic charge. However, the magnitude of the positive charge is 30 times higher than that of the negative charge.

Zeng et al. have previously shown that about 70% of the positive magnetic charge is concentrated in a 30% window of the nanowire width along the transverse direction. When the DW is at the junction 22 between the nanowire 16 and half-ring 23, the application of a magnetic field perpendicular to the nanowire 16 (±Y) direction may affect the motion. However, the effect depends on the strength and distribution of the magnetic field along the DW.

Figure 6A:
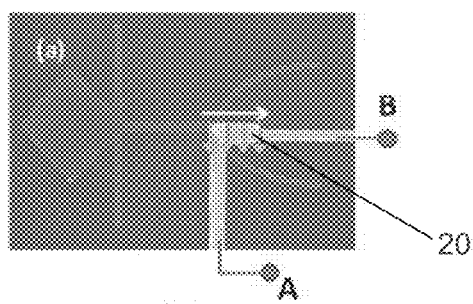
FIG. 6(a) shows the direction of a current in a conductive strip at a junction of the device, and the corresponding induced Oersted field direction.
Figure 6B:
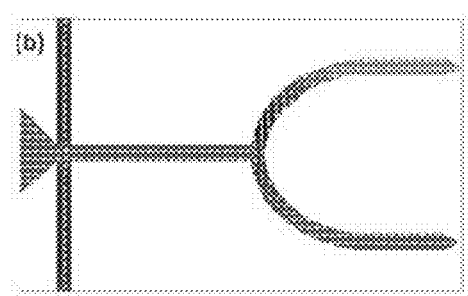
FIG. 6(b) shows the simulated magnetization with a 200 Gauss Oersted field applied in a transverse direction (in the direction of the arrows in FIG. 6(a)) to the DW.
Figure 6C:
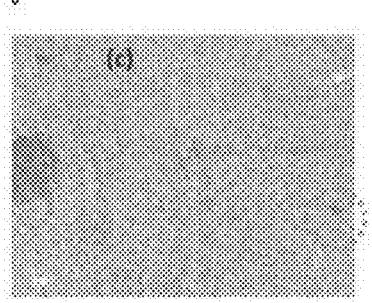
FIG. 6(c) shows an MFM image of the structure after an HH-U DW is injected and driven through the device while flowing a 5 mA current through the conductive strip.

The effect of the local transverse magnetic field on the DW motion is tested in the device 10 as shown in FIG. 6. To generate the transverse magnetic field, current is applied through the conductive strip 20, which induces an Oersted field perpendicular to the nanowire 16. The direction of the current and the Oersted field are shown schematically by the arrows in FIG. 6(*a*).

When no current is applied through the conductive strip 20 and a HH-U is injected by DW generator 12 and driven through the nanowire 16, the DW propagates into and switches the magnetization of the UHR 24, because the base of the DW is aligned with the top edge 16a of the nanowire 16. However, when a current of 5 mA is applied in the direction from from A to B, a local Oersted magnetic field of 200 Gauss which is transverse (−Y direction) to the nanowire 16 will be generated. The current required to induce a field having a magnitude of 200 Gauss (or more) can be reduced by modifying the dimensions of the conductive strip 20 in a manner known in the art.

As the field is distributed throughout the DW, the transverse magnetic field repels the HH DW. The transverse magnetic field therefore drives the DW into the LHR 26, despite the fact that the DW base is aligned with the top edge of the nanowire and it would ordinarily be more energetically favourable for the DW to propagate into the UHR 24. This is because the transverse field is strong enough to force the DW to move into the LHR 26.

Figure 7A:
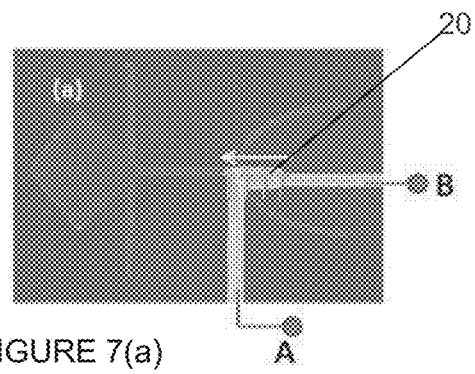
FIG. 7(a) shows the direction of a current in a conductive strip at a junction of the device, opposite to the current of FIG. 6(a), and the corresponding induced Oersted field direction.

As shown in FIG. 7(a), in which the directions of the current and the induced Oersted field are again depicted using arrows, when the experiment is repeated with an opposite current (−5 mA), the direction of the induced transverse field will be reversed with respect to that of FIG. 6(a).

Figure 7B:
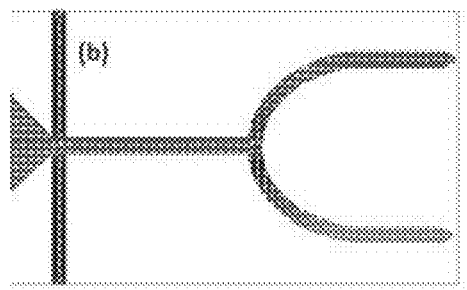
FIG. 7(b) shows the simulated magnetization with a 200 Gauss Oersted field applied in a transverse direction (in the direction of the arrows in FIG. 7(a)) to the DW.
Figure 7C:
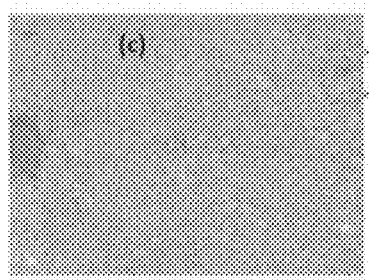
FIG. 7(c) shows an MFM image of the structure after an HH-U DW is injected and passed through the device while passing a −5 mA current through the conductive strip.

In FIGS. 7(b) and 7(c), the DW moves into the UHR 24 because the induced field attracts the DW in the same direction that it prefers to move (from the energy considerations discussed above).

Accordingly, the present inventors have shown that the direction of the DW motion into the half-ring 23 can be controlled by the sign of the current passed through the conductive strip 20. The conductive strip 20 acts as a gate to control the direction of the DW motion which provides the logic operation functionality. By changing the current direction in the conductive strip 20, the device 10 can be tuned to perform all basic logic operations. The inventors have found from micromagnetic simulations that the minimum field required to force the DW into the LHR 26 is 200 Gauss.

Figure 8:
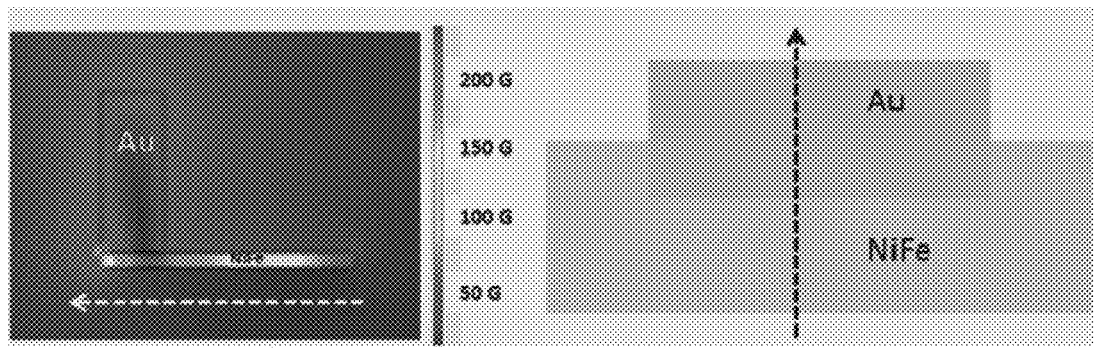
FIG. 8 shows the simulated magnetic field distribution along the transverse direction (+Y), and also schematically shows the relative locations of the conductive strip and a nanowire of the device.

In order for the logic operation to be possible, only one edge (in the depicted example, the top edge 16a) of the nanowire 16 at the junction 22 should be affected by the strong local Oersted field (200 Gauss). Accordingly, the conductive strip 20 is placed on the top edge 16a of the nanowire 16 with a small (25%) overlap onto the nanowire 16 as shown in FIG. 1. The magnetic field distribution in the NiFe nanowire 16 due to the current carrying Au conductive strip 20 can be estimated by multiphysics software such as COMSOL Multiphysics of COMSOL, Inc. A cross-sectional image of a simulation of the nanowire 16 with Au conductive strip 20 is shown in FIG. 8. FIG. 8 shows the transverse (Y-direction, across the width) field distribution along the direction of NiFe nanowire 16.

When a current of 5 mA is passed through the Au stripe line, the Oersted field distribution generated along the nanowire reveals that field is higher (200 Gauss) at the top edge of the nanowire due to the overlap and lower (50 Gauss) at the bottom edge of the nanowire. The minimum field required to affect the DW motion at the junction is 200 Gauss. So only the DWs with base pointing towards the top edge of the nanowire will be affected by the transverse field due to stripe line. Whereas the DWs with base pointing the lower edge of the nanowire will not be affected as the field (50 Gauss) is not strong enough.

Embodiments of the device 10 provide a single structure with a current carrying stripe line 20 which can perform all basic logic operations. The direction of the current passing through the stripe line 20 controls the specific logic function. The inventors have therefore devised, for the first time, a DW-based reconfigurable magnetic logic. The underlying principles are the transverse DW selective switching due to the DW transverse energy distribution, and the effect of the transverse local field on DW dynamics. These underlying concepts have been verified by micromagnetic simulations and MFM imaging as described above and as shown in the Figures.

Referring now to FIG. 11, there is shown an alternative embodiment of a non-volatile logic device 110. The device 110 is structured similarly to device 10, and comprises a first input element 114 in the form of a nanowire which is joined to and aligned perpendicularly with respect to a second nanowire (second input element) 116. A non-magnetic conductive strip 120 is disposed on the second nanowire 116 at or near a junction 122 of the second nanowire 116 with an output section 123 comprising first 124 and second 126 output elements. The non-magnetic conductive strip 120 partially overlaps the second nanowire 116 along its width, by up to 30% (but preferably by around 25%) as described earlier. The first and second input elements 114 and 116, the output section 123 and the non-magnetic conductive strip may be substantially the same as their counterparts in the device 10, for example.

The device 110 differs from the device 10 largely in that domain wall generation is achieved by means of an elongate non-magnetic conductive strip 112 contacting an input nanowire 111 which is aligned along the axis of the second nanowire 116. Input nanowire 111 has an initial magnetization direction. In order to inject a transverse DW into nanowire 116, a current 130 is passed through the non-magnetic conductive strip 112 in order to induce a magnetic field in part of input nanowire 111 which is in the opposite direction to the initial magnetization direction of input nanowire 111, thereby causing a local magnetization reversal and nucleating a DW, which then travels into nanowire 116 via chirality selector 114 as described earlier in relation to the device 10.

Figure 12:
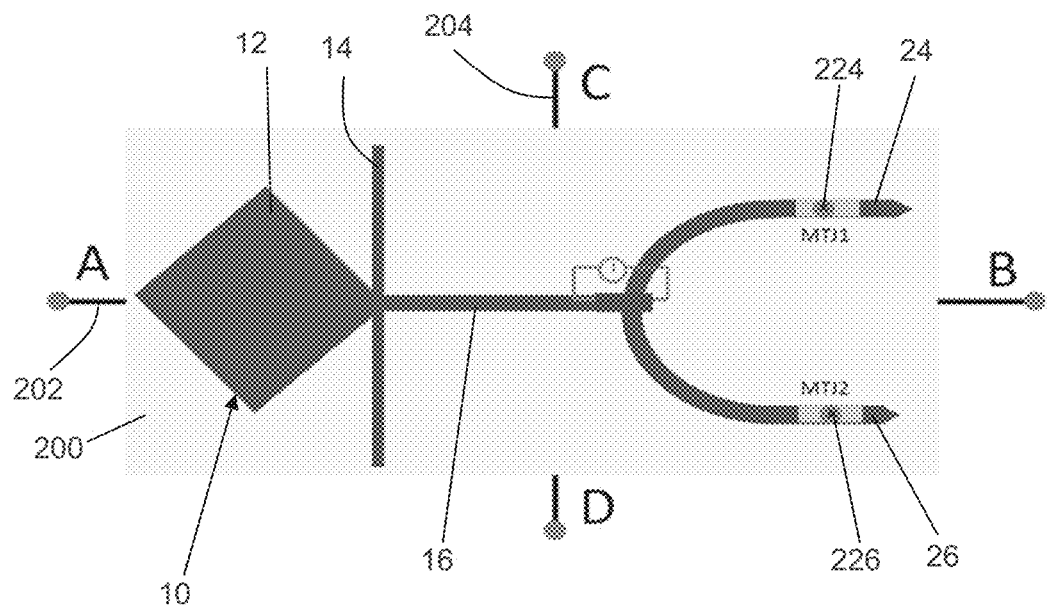
FIG. 12 shows a schematic of a simple non-volatile logic circuit including the device of FIG. 1.

Turning to FIGS. 12 to 16, there are shown embodiments of non-volatile logic circuits comprising the device 10 or the device 110. In FIG. 12, non-volatile logic device 10 is in contact with a non-magnetic conductive substrate 200, which may be a gold layer, for example. The gold layer is in contact with a first wire 202 extending between terminals A and B and aligned parallel to the second input element 16, and a second wire 204 extending between terminals C and D and aligned parallel to the first input element 14. A first magnetic tunnel junction (MTJ) 224 is formed on first output element 24 and a second MTJ 226 is formed on the second output element 26. MTJ 224 is illustrated in more detail in FIG. 15, and comprises an insulating layer 230 (such as $Al_2O_3$, for example) disposed on part of the second output element 24, and a hard layer 232 disposed on the insulating layer 230. The hard layer 232 is formed from a material having a lower magnetic coercivity than that of the second output element 24. MTJ 226 is of identical configuration to MTJ 224.

Figure 13:
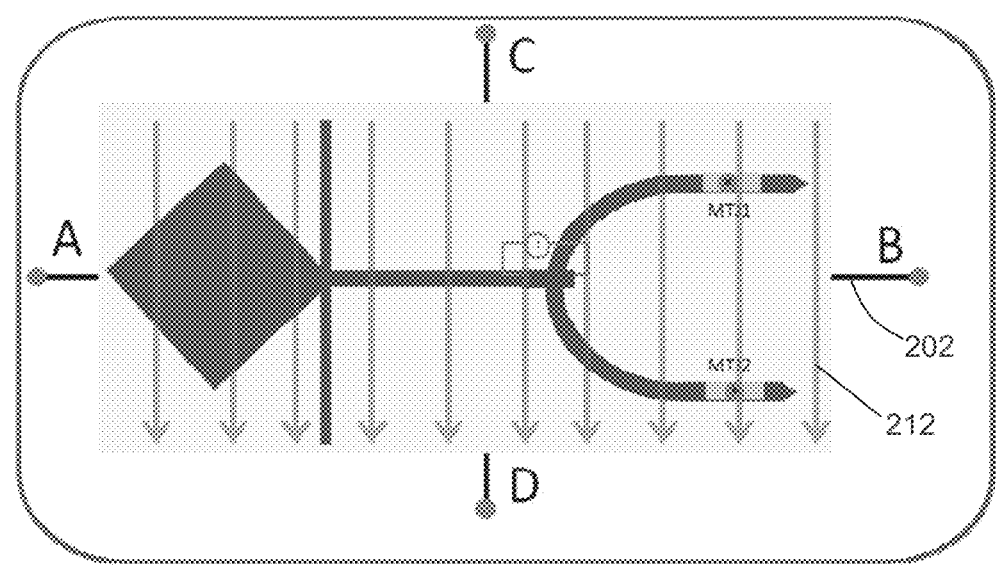
FIGS. 13 and 14 illustrate writing and reading operations in the circuit of FIG. 12.

FIG. 13 schematically illustrates writing of a bit to the first input element 14. A current is passed along wire 202 between terminals A and B. The current is of sufficient magnitude to induce a magnetic field of at least 300 Gauss transverse to the wire 202, in the direction shown by arrows 212 (the Y-direction), such that the magnetization of the first input element 14 is saturated in the −Y direction. Accordingly, the current passing from A to B writes a "0" bit to input element 14 as described earlier.

Figure 14:
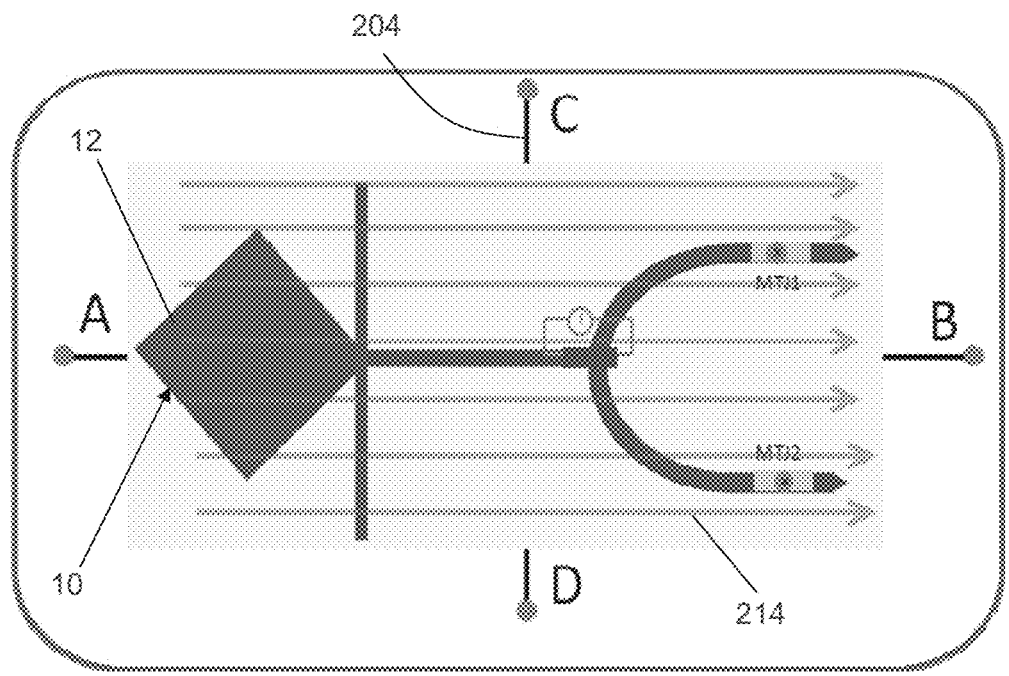

FIG. 14 schematically illustrates writing of a bit to the second input element 16. A current is passed along wire 204 from C to D, inducing a magnetic field in the +X-direction as indicated by arrows 214. The current is sufficient to induce a field which saturates the magnetization of the second input element 16 in the +X-direction. Accordingly, the current passing from C to D writes a "1" bit to the second input element 16.

The field applied to the second input element 16 also saturates the magnetizations of DW generator 12 and outputs 24, 26 in the +X-direction. A DW can be injected into the second input element 16 by reversing the direction of the current (i.e., from D to C), at the same time reducing the magnitude of the current such that the induced field is below the level required to saturate the nanowire 16 and outputs 24, 26. This causes switching of the magnetization in the DW generator 12 as described above, thus nucleating a DW which travels into the nanowire 16. The DW subsequently travels into either the first output 24 or the second output 26, depending on the DW type (HH or TT) and chirality (up or down), and the direction of the current through the conductive element (gate) 20 as described above, which will in turn determine the logical function implemented by device 10. The outputs 24 and 26 can be read out by measuring the tunnelling current at the respective MTJs 224 and 226.

Figure 16:
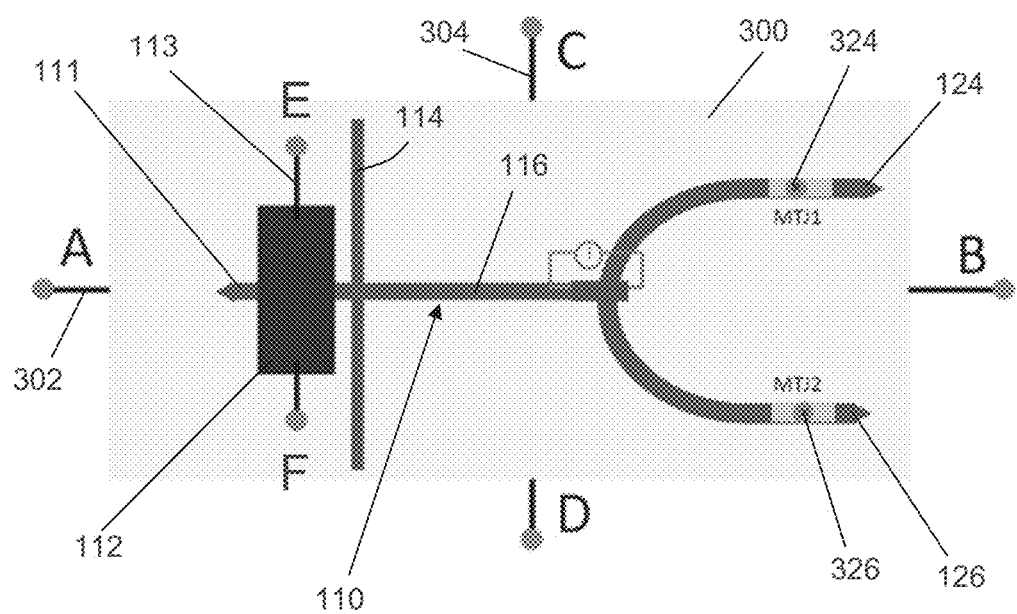
FIG. 16 shows a schematic of a simple non-volatile logic circuit including the device of FIG. 11.

Referring to FIG. 16, there is shown an alternative embodiment of a non-volatile logic circuit. The circuit comprises the device 110 of FIG. 11, in contact with a non-magnetic conductive substrate 300 (which may be formed from gold, for example). The substrate 300 is in contact with a first wire 302 extending between terminals A and B, parallel to the second input element 116, and a second wire 304 extending between terminals C and D, parallel to the first input element 114. A first MTJ 324 is formed on the first output element 124 and a second MTJ is formed in the second output element 126. The MTJs 324, 326 may be identical in configuration to MTJs 224, 226, for example.

Figure 15:
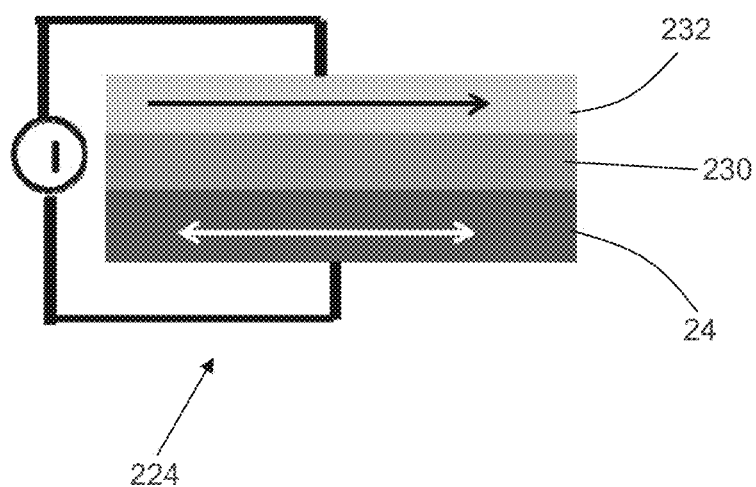
FIG. 15 is a schematic cross-sectional view of a magnetic tunnel junction of the circuit of FIG. 12.

Writing and reading of bits in the circuit of FIG. 16 is identical to the corresponding operations in the circuit of FIG. 12, as described with reference to FIGS. 13 to 15. The major difference between the circuits of FIGS. 12 and 16 is in the manner in which DWs are injected into the second input element 116, due to the difference in configuration of devices 10 and 110. When second input element 116 is saturated, for example in the +X-direction, input nanowire 111 will also be saturated in that direction. In order to nucleate a DW, a current is passed from terminal F to terminal E through the non-magnetic conductive strip 112 to cause a local magnetization reversal in input nanowire 111, thereby nucleating a DW which travels into nanowire 116 via chirality selector 114.

EXAMPLES

Having now generally described the invention and presently preferred embodiments, the same will be more readily understood through reference to the following examples which are provided by way of illustration, and are not intended to be limiting.

Example 1

NAND and AND Gate Operations

The current direction through the conductive strip 20 (which in this example is a copper stripe line) is fixed in one direction. A local Oersted field of −200 Gauss is produced by the copper strip line 20 at the top part 16a of the nanowire 16 by flowing current from A to B (FIG. 6). The snapshots of the magnetization for all four possible combinations are shown in FIG. 9.

Figures 9A, 9B, 9C, 9D:
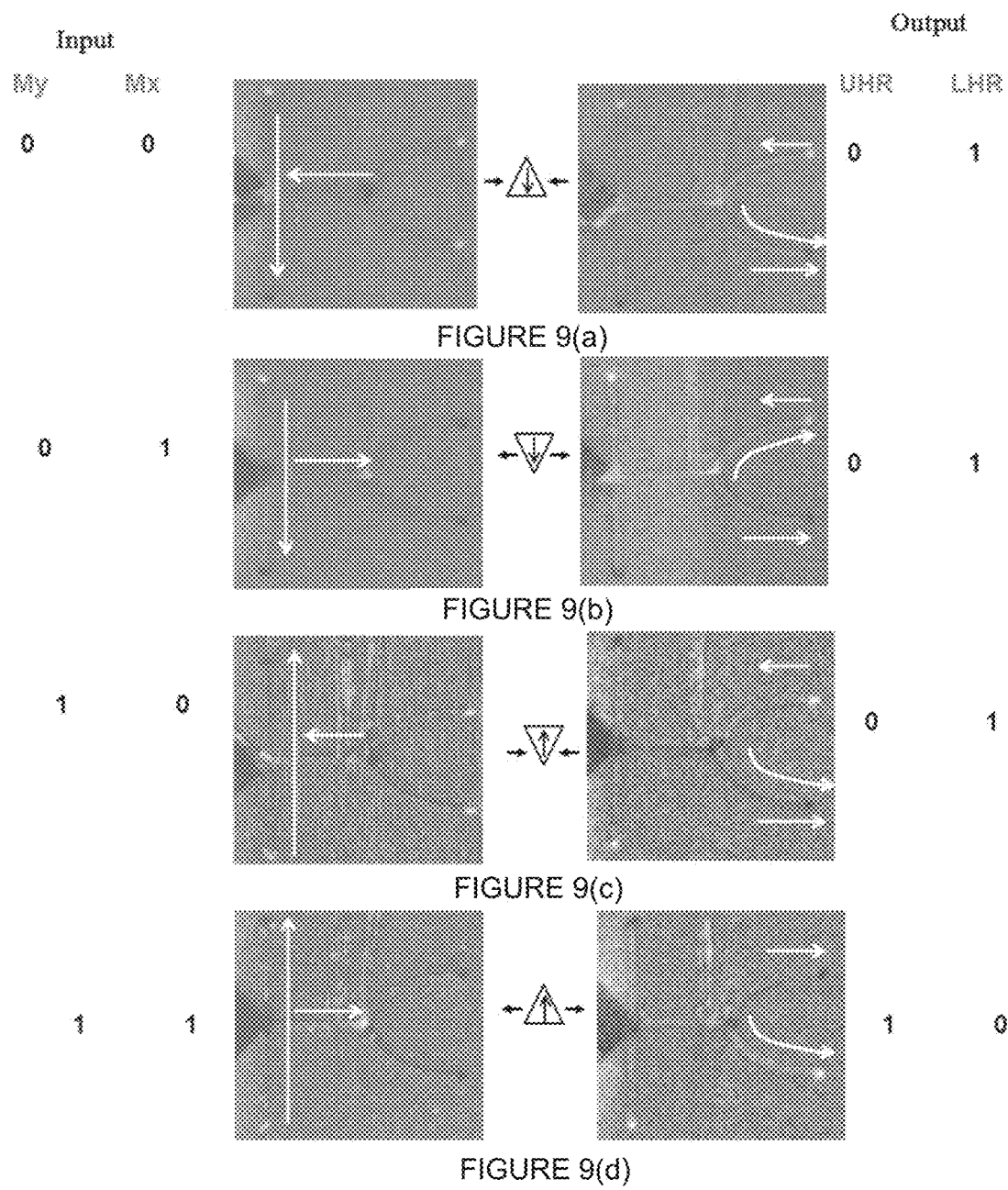
FIGS. 9(a) to 9(d) show MFM images of the device before and after a logic operation, for all four possible combinations of domain wall reaching the junction, when a current of 5 mA is applied along a first direction along the conductive strip.

Inputs "0" and "0": When the magnetization direction of the chirality selector 14 and the nanowire 16 are pointing along their respective negative directions (−Y and −X), which makes the input logic bits as "0" and "0", a HH-D is injected into the nanowire 16. When the DW reaches the junction 22, the effect of the current-induced transverse magnetic field on HH-D is negligible because the DW base is aligned with the bottom 16b of the nanowire 16. The DW moves into the LHR 26 because the lower part of the DW has higher energy. This, in turn, results in the switching of the LHR 26 magnetization to point along the (+X) direction, which is equal to an output binary value of "1" as shown in FIG. 9(a).

Note that before the HH-D reaches the LHR 26, both the UHR 24 and the LHR 26 have their magnetization aligned in the −X direction due to the X-component of the external magnetic field which is applied to magnetize the nanowire 16. Accordingly, each output 24, 26 initially has logic state "0", with output 24 remaining in state "0" and output 26 switching to state "1" as shown in FIG. 9(a).

Inputs "0" and "1": As shown in FIG. 9(b), when the magnetization of the nanowire 16 is reversed to the +X-direction by reversing the X-component of the applied external field, the input bits are changed to "0" and "1" (the output bits are initially in states "1" and "1" due to the field reversal). A TT-D will be injected into the nanowire 16. As the TT-D DW reaches the junction 22, the induced transverse magnetic field attracts the DW into the UHR 24. Even without a current passing through the strip 20, the TT-D would move into the UHR 24 because it has higher energy at the upper part of the DW; the transverse Oersted field assists the DW motion to the UHR 24 in this case. The LHR is unchanged and is maintained in the +X-direction (logical "1").

Inputs "1" and "0": As shown in FIG. 9(c), when the magnetization direction of the chirality selector 14 is set to the +Y-direction ("1") and the nanowire 16 magnetization is saturated along the −X-direction ("0"), a HH-U is injected into the nanowire 16. Again, the HH-U has higher energy at the upper part. The transverse Oersted field is strong at the base of the DW where most of the DW charge is concentrated. In this case, the transverse field acts against the DW motion. The DW is pushed in to the LHR 26 even though the DW has higher energy at the upper part, due to the opposing local magnetic field. This results in reversal of the magnetization of the LHR 26 to the +X direction, which corresponds to an output bit of "1".

Inputs "1" and "1": Finally, when the direction of the magnetization of the chirality selector 14 is reversed to the +Y-direction, the input bits become "1" and "1", and a TT-U is injected into the nanowire 16. Similarly to the case of HH-D, this DW does not get affected by the local Oersted field as the base of the DW points towards the lower edge of the nanowire. The field strength at the DW is much weaker and so cannot affect the DW motion into the LHR 26. The DW motion into the LHR 26 and subsequent change of magnetization corresponds to an output bit of "0" as shown in FIG. 9 (d).

A truth table formed from the input combinations above shows that when the LHR 26 is considered as the output, the structure 10 is acting as a NAND gate.

TABLE 2

| Input 1, $M_y$ | Input 2, $M_x$ | Output, M (LHR) |
| --- | --- | --- |
| ↓ 0 | ← 0 | → 1 |
| ↓ 0 | → 1 | → 1 |

TABLE 2-continued

| Input 1, $M_y$ | Input 2, $M_x$ | Output, M (LHR) |
|---|---|---|
| ↑ 1 | ← 0 | → 1 |
| ↑ 1 | → 1 | ← 0 |

If the output is read at the UHR 24, for all four possible input combinations, the output at UHR 24 is found to be complementary with that at LHR 26. Accordingly, the UHR 24 provides the output of an AND gate operation as shown in Table 3.

TABLE 3

| Input 1, $M_y$ | Input 2, $M_x$ | Output, M (UHR) |
|---|---|---|
| ↓ 0 | ← 0 | ← 0 |
| ↓ 0 | → 1 | ← 0 |
| ↑ 1 | ← 0 | ← 0 |
| ↑ 1 | → 1 | → 1 |

Example 2

NOR and OR Gate Operations

When the current direction of the copper stripe line 20 is reversed, the perpendicular Oersted field that is generated is reversed to +200 Gauss. Similarly to the previous example, the field strength is higher at the top edge 16a of the nanowire 16. From the previous logic operation it can be understood that only two input possibilities (TT-D and HH-U) are affected by the transverse field. The base of these two types of DWs faces the top edge 16a of the nanowire 16 which falls under the strong transverse field from the current stripe line 20. For the other two input possibilities, TT-U and HH-D, the transverse field cannot affect the motion as the field strength at the base of the DW becomes weaker. The outputs for these two cases, corresponding to inputs (0&0) and (1&1), are the same as for the previous operation of Example 1 with +5 mA current. Hence only the two cases (0&1) and (1&0) with reversed current direction (−5 mA) are discussed in this Example, with reference to FIGS. 10(a) and 10(b).

When the magnetization of the chirality selector 14 is saturated in the −Y-direction and the nanowire 16 is saturated in the +X-direction, the input bits are "0" and "1". A TT-D will be injected into the nanowire 16. When there is no current through the stripe line 20, the TT-D moves into the UHR 24 because it has higher energy at the upper part of the DW. When the current flows from B to A, the transverse Oersted field generated at the junction 22 repels the TT-D. As the DW reaches the junction 22, the transverse field forces the DW to move into the LHR 26 even though the UHR 24 is preferred by the DW (from energetic considerations). The DW motion results in the switching of the magnetization of the LHR 26 along −X-direction (from "1" to "0") as shown in FIG. 10(a).

As shown in FIG. 10(b), when the magnetization of the chirality selector 14 is saturated in the +Y-direction and the nanowire 16 is saturated in the −X-direction, the input bits are "1" and "0". A HH-U is injected into the nanowire 16. As the HH-U reaches the junction 22, the transverse magnetic field attracts the DW into the UHR 24. Even in the absence of the current, the HH-U moves into the UHR 24 because it has higher energy at the upper part of the DW; the transverse Oersted field assists the DW motion in this case. The LHR 26 is unchanged and is maintained in the +X-direction ("0").

As shown in the truth table for this Example, Table 4, for the output at LHR 26, the logic operation results in NOR gate functionality whereas at the UHR 24 it results in OR gate functionality (complementary to the LHR 26 output).

As can be seen from Examples 1 and 2, a single structure 10 can perform a NAND gate operation when the current through the conductive strip 20 is +5 mA, and a NOR gate operation when the current is −5 mA. Moreover, in each operation, the device 10 provides values for two separate logic functions, which always complement each other.

TABLE 4

| OR | | | NOR | | |
|---|---|---|---|---|---|
| Input 1, $M_y$ | Input 2, $M_x$ | Output, M (UHR) | Input 1, $M_y$ | Input 2, $M_x$ | Output, M (LHR) |
| ↓ 0 | ← 0 | ← 0 | ↓ 0 | ← 0 | → 1 |
| ↓ 0 | → 1 | → 1 | ↓ 0 | → 1 | ← 0 |
| ↑ 1 | ← 0 | → 1 | ↑ 1 | ← 0 | ← 0 |
| ↑ 1 | → 1 | → 1 | ↑ 1 | → 1 | ← 0 |

Example 3

XNOR, XOR and NOT Gate Operations

By imposing an additional condition on the current direction through the strip 20 according to the magnetization direction of the nanowire, it is possible to generate XOR and XNOR gates as shown in the Table 5. The current should flow from A to B when the magnetization of the nanowire aligns along the −X-direction and from B to A when the magnetization of the nanowire is along the +X-direction. The same configuration of structure 10 performs an XNOR operation at the LHR 26 and and an XOR operation at the UHR 24.

If the chirality selector 14 is unchanged along the +Y-direction and the current flows from A to B, the output of the structure 10 acts as an inverter circuit at the UHR 24 for the magnetization of the nanowire direction, resulting in NOT gate operation (Table 6).

TABLE 5

| XOR | | | XNOR | | |
|---|---|---|---|---|---|
| Input 1, $M_y$ | Input 2, $M_x$ | Output, M (UHR) | Input 1, $M_y$ | Input 2, $M_x$ | Output, M (LHR) |
| ↓ 0 | ← 0 | ← 0 | ↓ 0 | ← 0 | → 1 |
| ↓ 0 | → 1 | → 1 | ↓ 0 | → 1 | ← 0 |
| ↑ 1 | ← 0 | → 1 | ↑ 1 | ← 0 | ← 0 |
| ↑ 1 | → 1 | ← 0 | ↑ 1 | → 1 | → 1 |

TABLE 6

| $M_y$ | Input, $M_x$ | Output, M (UHR) |
|---|---|---|
| ↑ 1 | ← 0 | → 1 |
| ↑ 1 | → 1 | ← 0 |

Whilst the foregoing description has described exemplary embodiments, it will be understood by those skilled in the technology concerned that many variations in details of design, construction and/or operation may be made without departing from the present invention.

The invention claimed is:

1. A non-volatile logic device, comprising:
   a first input element which is magnetizable along a first direction of magnetization to impart or change a chirality of a domain wall traversing the first input element, the chirality representing a first logical input;
   a second input element joined to the first input element to transport the domain wall, the second input element being magnetizable along a second direction of magnetization which is orthogonal to the first direction of magnetization, a magnetization of the second input element along the second direction of magnetization representing a second logical input;
   a bifurcated output section connected to the second input element at a junction, the output section comprising a pair of output elements for selectively receiving the domain wall from the second input element, a magnetization of at least part of the respective output elements being changeable by propagation of the domain wall along the respective output elements; and
   a non-magnetic conductive element disposed in partially overlapping relationship with the second input element at or near the junction;
   wherein the magnetization in an output element after propagation of the domain wall represents a value of a logical function of the first logical input and/or the second logical input, or a logical complement of the value; and
   wherein the logical function is selectable by passing an electrical current through the non-magnetic conductive element to induce a magnetic field of a desired magnitude and direction in the second input element.

2. A non-volatile logic device according to claim 1, comprising a domain wall generator coupled to the first input element, the domain wall generator being configured to nucleate a domain wall.

3. A non-volatile logic device according to claim 2, wherein the domain wall generator comprises a ferromagnetic element having low shape anisotropy.

4. A non-volatile logic device according to claim 2, wherein the ferromagnetic element is a diamond-shaped pad which is connected to the first input element at one of its vertices.

5. A non-volatile logic device according to claim 2, wherein the domain wall generator comprises a magnetic material which is in contact with a current-carrying nanowire, the current-carrying nanowire being configured to effect a local magnetization reversal in the magnetic material by an induced Oersted field.

6. A non-volatile logic device according to claim 5, wherein the domain wall generator is joined to the first input element and the second input element at a junction between the first and second input elements.

7. A non-volatile logic device according to claim 1, wherein the non-magnetic conductive element is in contact with part of the second input element at or near the junction with the output section.

8. A non-volatile logic device according to claim 1, wherein the first and second input elements and the output section are each formed from a magnetic material capable of exhibiting in-plane magnetic anisotropy.

9. A non-volatile logic device according to claim 8, wherein the magnetic material is a magnetic metal or a magnetic alloy.

10. A non-volatile logic device according to claim 9, wherein the magnetic material is selected from the group consisting of Fe, Ni, CoFe, AlFe, CoNi, and NiFe.

11. A non-volatile logic device according to claim 1, wherein the first and second input elements and the output section are formed as a unitary structure.

12. A non-volatile logic device according to claim 11, wherein the unitary structure is a planar structure.

13. A non-volatile logic device according to claim 12, wherein the planar structure has a depth of approximately 10 nm or less.

14. A non-volatile logic device according to claim 1, wherein the first input element is a nanowire having an aspect ratio of about 50:1 or greater.

15. A non-volatile logic device according to claim 14, wherein the nanowire is approximately 5 um in length and approximately 100 nm in width.

16. A non-volatile logic device according to claim 1, wherein the second input element is a nanowire.

17. A non-volatile logic device according to claim 16, wherein the second input element is approximately 2 um long and between 140 nm and 160 nm wide.

18. A non-volatile logic device according to claim 1, wherein the first input element and the second input element are joined orthogonally to each other at an input junction, and the domain wall generator is joined with the first and second input elements at the input junction.

19. A non-volatile logic device according to claim 1, wherein each output element has an end portion which is substantially parallel to the magnetization direction of the second input element.

20. A non-volatile logic device according to claim 19, wherein the output section is substantially U-shaped.

* * * * *